United States Patent [19]

Cook et al.

[11] Patent Number: 5,034,856
[45] Date of Patent: Jul. 23, 1991

[54] MODULAR HOUSING ASSEMBLY FOR TWO INCOMPATIBLE CIRCUITS

[75] Inventors: Gordon V. Cook, Lexington; Curtis A. Risley, Lincoln; Larry E. Telford, Bedford; Mark S. Kotfila, Chelmsford; Dick Stanley, Holliston, all of Mass.

[73] Assignee: Hewlett-Packard Company, Palo Alto, Calif.

[21] Appl. No.: 426,340

[22] Filed: Oct. 24, 1989

[51] Int. Cl.$^5$ .............................................. H05K 9/00
[52] U.S. Cl. ................................. 361/424; 174/35 R; 174/35 GC
[58] Field of Search .................... 174/50.51, 50.52, 51, 174/52.1, 52.2, 63, 255, 266, 262, 261, 35 GC, 35 R, 51; 361/394, 395, 399, 412, 413, 424, 383, 415; 439/75, 528, 538

[56] References Cited

U.S. PATENT DOCUMENTS

| | | | |
|---|---|---|---|
| 4,628,412 | 12/1986 | Nigorikawa | 361/424 |
| 4,661,888 | 4/1987 | Jewell et al. | 361/424 |
| 4,747,019 | 5/1988 | Ito et al. | 361/424 |

Primary Examiner—Leo P. Picard
Assistant Examiner—Donald A. Sparks
Attorney, Agent, or Firm—Richard F. Schuette

[57] ABSTRACT

A modular housing assembly is provided for two incompatible circuits, for example an RF circuit and a digital circuit, mounted on the same printed circuit board. The housing assembly has a base member and a cover member which are meshed to form two double walled compartments separated by a double conducting wall. The circuit board has at least one bridge physically and electrically connecting the two circuits on the board which bridges pass through corresponding channels in the separating wall and each contain a matrix of plated through holes which operate to extend the wall through the bridge. Interconnecting wiring is woven through the holes to pass desired signals. Filters are provided between the interconnecting wiring and each circuit to eliminate conductive interference. Conductive gaskets are provided at all junctions of the separating wall with a housing member or with a circuit board to further reduce radiation leakage between the circuits.

14 Claims, 4 Drawing Sheets

MODULAR HOUSING ASSEMBLY FOR TWO INCOMPATIBLE CIRCUITS

FIELD OF THE INVENTION

This invention relates to printed circuit board housing assemblies and more particularly to a modular housing assembly for two incompatible circuits mounted on the same printed circuit board.

BACKGROUND OF THE INVENTION

There are many applications in commercial, medical, military, and other fields where two electrically incompatible circuits, for example an RF circuit and a digital circuit, are required in the same device. In order to minimize manufacturing costs and to reduce the size, weight and complexity of such devices, it is desirable that the devices be formed on a single printed circuit board mounted in a single housing. However, conductive and radiated noise between the circuits frequently makes it impossible to put the two incompatible circuits on the same board, and heretofore it has not been possible to fabricate such incompatible circuits on the same board for packaging in a single housing.

A need therefore exists for an improved housing assembly which permits incompatible circuits in general, and RF/digital circuits in particular to be mounted on the same printed circuit board and packaged in a common housing.

SUMMARY OF THE INVENTION

In accordance with the above, this invention provides a modular housing assembly for two incompatible circuits mounted on the same printed circuit board. The assembly has first and second compartments separated by a conductive wall, each of the compartments being surrounded on all sides by conductive material. At least one channel is formed through the wall. The circuit boards are mounted with one of the circuits in the first compartment and the other circuit in the second compartment. The board includes a bridge which physically and electrically connects the circuits, which bridge passes through a corresponding channel. A plurality of rows and columns of plated through holes are formed in the bridge which holes connect ground planes to form a continuous ground plane through the circuit board. Electrical wiring interconnecting circuits passes through the bridge, being woven to pass between the holes. Conductive gaskets are provided between each side of the board and the separating wall at least in the area of the bridge.

Conductive noise is reduced by use of a filter means, preferably an LC filter, in each of the circuits between the interconnecting electrical wiring and the remainder of the circuit.

For the preferred embodiment, the separating wall is a double wall. In particular, the housing assembly is formed of a base housing member and a cover housing member, each of which has conductive sides, with a portion of the separating conducting wall being formed between two of such sides for at least one of the members at a point intermediate the ends thereof. The base housing member also has a conductive base and the cover housing member also has a conductive top surface. When the two members are meshed to form a housing assembly, the sides and separating walls are all double walls.

The plated through holes are in a matrix which covers substantially the entire area of the bridge and alternate rows of the matrix are preferably offset so that there is no straight path between the circuits through the matrix of bridge holes.

The foregoing and other objects, features and advantages of the invention will be apparent from the following more particular description of a preferred embodiment of the invention as illustrated in the accompanying drawings.

IN THE DRAWINGS

DETAILED DESCRIPTION

Figure 1:
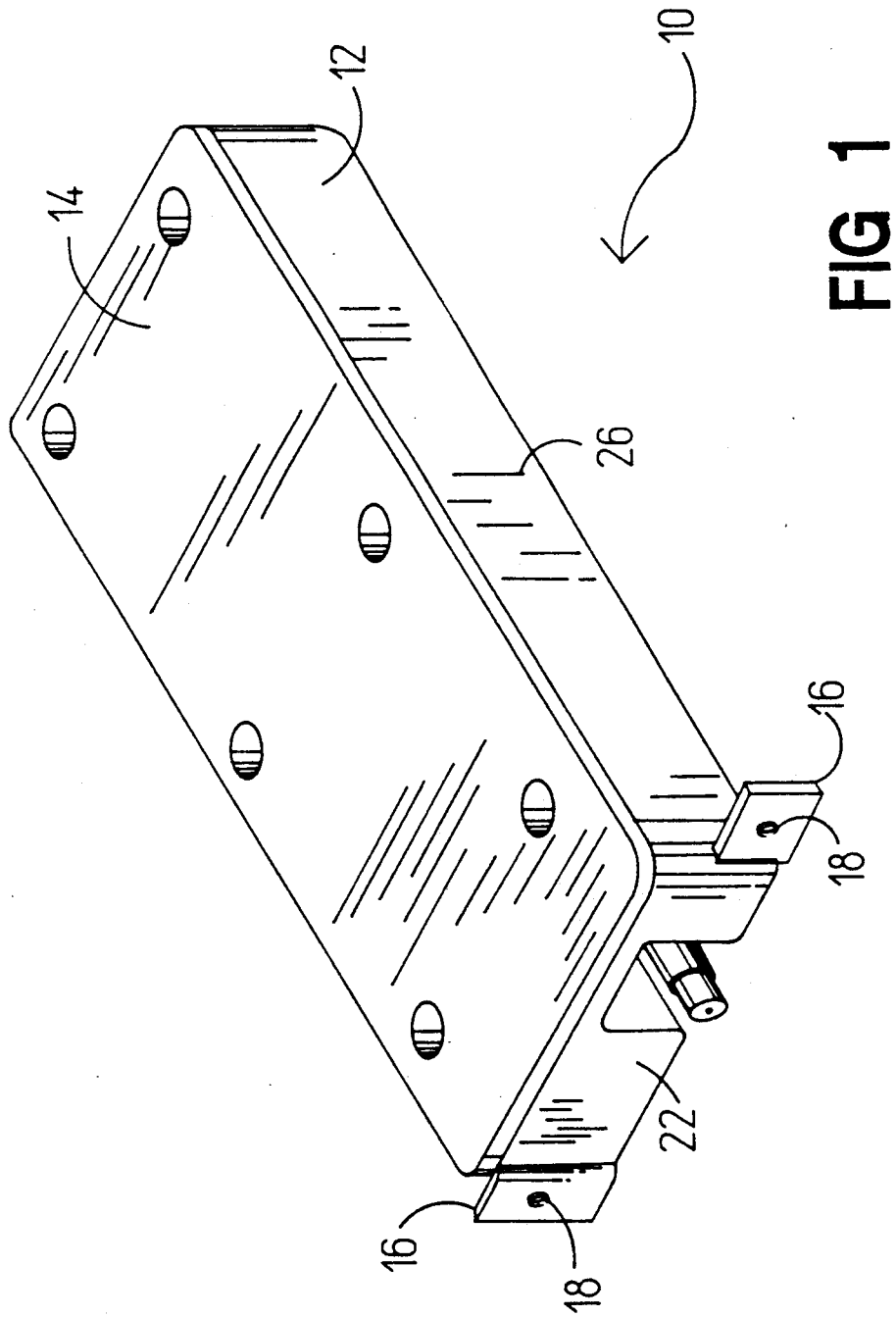
FIG. 1 is a perspective view of an assembled housing assembly in accordance with a preferred embodiment of the invention.

Referring to the figures, the housing assembly 10 of this invention is formed of a base housing member 12 and a cover housing member 14. Base member 12 has a pair of projecting flanges 16 with screw holes 18 formed therein which may be utilized for securing the housing to a rack, other components, or the like.

Figure 2:
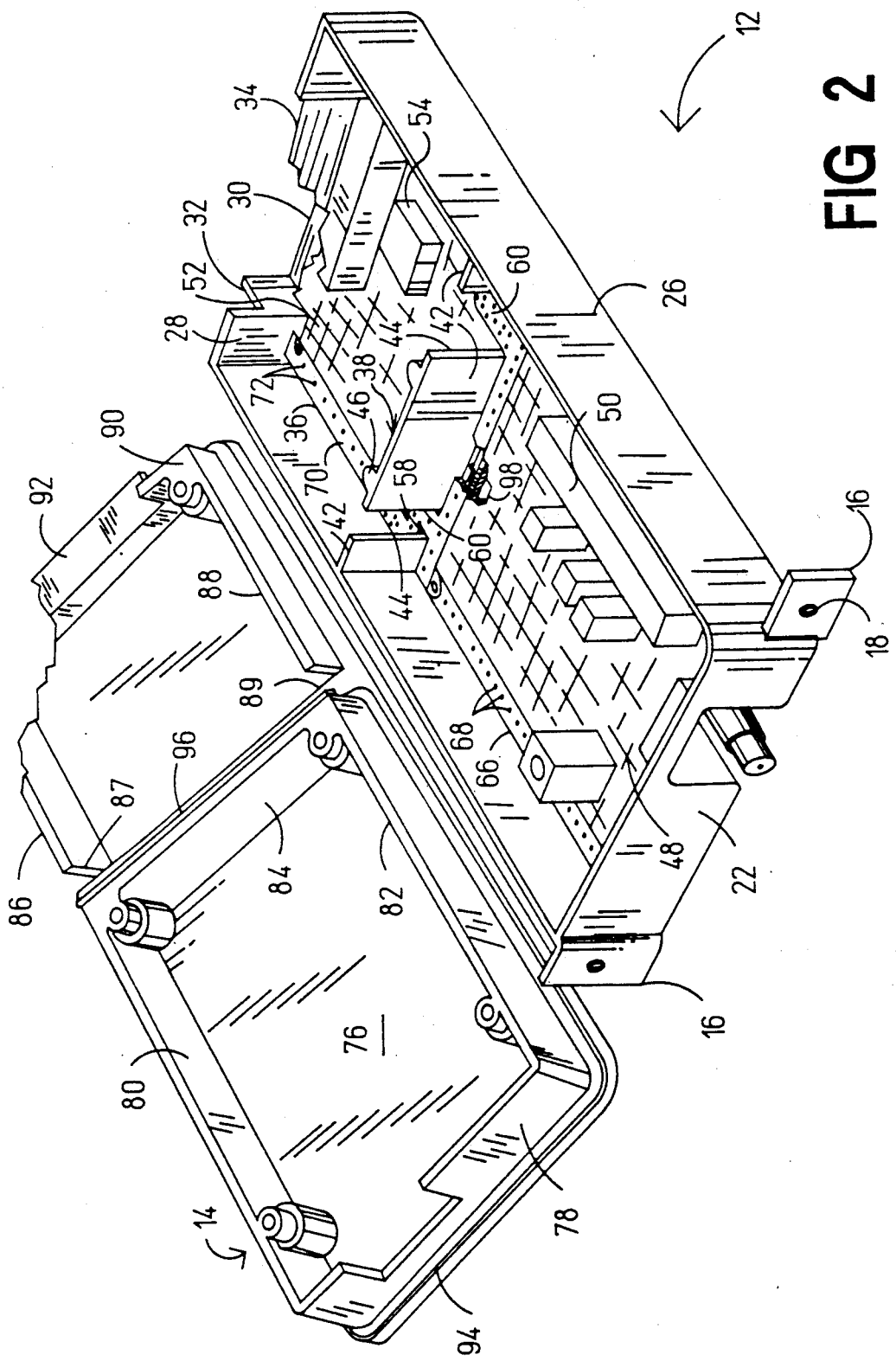
FIG. 2 is a perspective view of the housing assembly shown in FIG. 1 with the cover member removed and turned over.

Referring more particularly to FIG. 2, it is seen that base member 12 and cover member 14 are parts which are machined, cast or otherwise formed, from a conductive metal such as aluminum. Base member 12 has a base or bottom 20 with an upstanding rear wall 22, side walls 24 and 26, and a forward wall 28. The walls are connected at the corners to form a continuous wall except where forward wall 28 is broken, the broken area being filled by a horizontal projection 30 and vertical wall projections 32. A connector 34 at the end of circuit board 36, which connector is shown partially broken in FIG. 2, fits in the compartment formed by projection 30 and walls 32. The final element of housing 12 is separator wall 38 which, as may be best seen in FIGS. 3 and 4, has a boss portion 40 below the circuit board and an upstanding portion 42 having a pair of channels 44 formed therein. The center section of upstanding wall 42 has a pair of enlarged support and guide studs 46 formed behind it.

Circuit board 36 is divided into two portions which, for example, will be assumed to be an RF portion 48, having for example an RF oscillator 50 mounted therein, and a digital portion 52, having for example a digital clock chip 54 mounted therein. While only a few representative components are shown on each portion of circuit board 36 in FIG. 2, it is to be understood that each of these circuits would contain a variety of standard components and interconnecting wiring. Circuit board 36 has a cutout 56 formed therein and a pair of side notches 58 formed therein in the space between circuits 48 and 52. The cutout 56 and notches 58 define a pair of bridges 60 which interconnect the circuits 48 and 52 of the circuit board.

Figure 5:
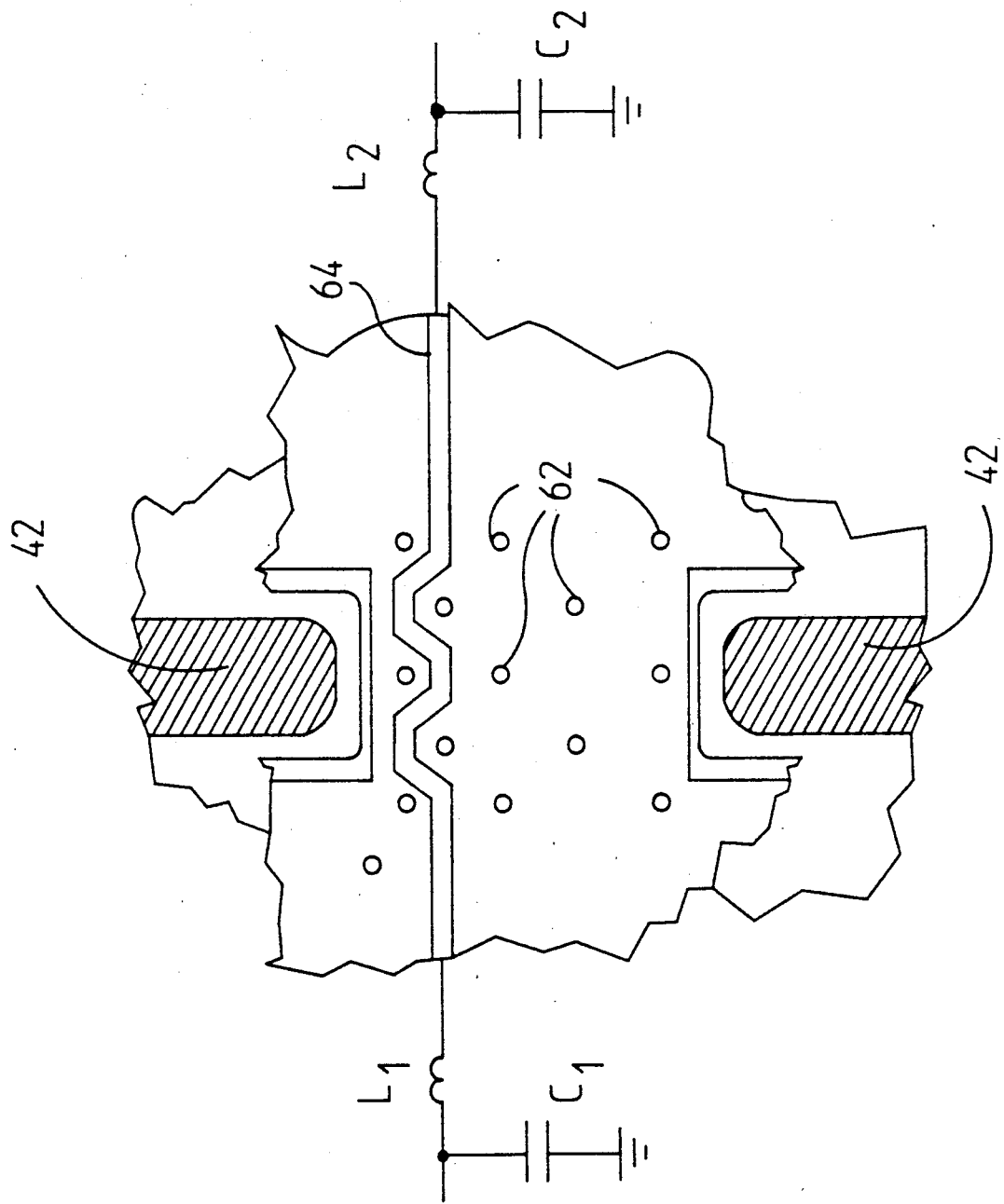
FIG. 5 is a top cutaway view, partially in schematic, of the circuit board in a bridge area.

As may be best seen in FIG. 5, a matrix of plated through holes 62 is formed in each bridge area, the matrix covering substantially the entire bridge area. The holes are in rows and columns with alternate rows being preferably offset as shown in FIG. 5 so that there is no clear path between circuits 48 and 52 through the matrix of holes. Conductive wiring 64, a single wire of which is shown in FIG. 5, is woven between the holes 62 to interconnect the two circuits. In order to eliminate conductive noise or interference between the circuits, a filter consisting of an inductor L and a capacitor C is provided in each of the circuits 48 and 52 between interconnecting leads 64 and the remainder of the circuit. The values of the inductors and capacitors will vary with applications and may be determined by one skilled in the art.

In addition to the plated through holes 62 in bridge 60, there are also ground plane areas 66 around the entire periphery of circuit 48 which have plated through holes 68 formed therein, and there are ground plane areas 70 along the sides of circuit 52 having plated through holes 72 formed therein. Each plated through hole 62, 68 and 72 forms a continuous ground plane through the circuit board, interconnecting ground planes on the two sides thereof. The arrays of closely spaced plated through holes essentially serve as extensions of the walls to prevent leakage of radiated signal through the circuit board dielectric, either between the circuits or from the assembly.

Cover member 14 has a top 76 with a downwardly projecting rear wall 78, downwardly projecting side walls 80 and 82, and a compartment separating wall 84. The walls 78, 80 and 82 are connected to form a continuous wall and, in conjunction with bottom wall 20 and top wall 76, define an RF circuit compartment. Spaced slightly from the ends of side walls 80 and 82 by spaces 87 and 89 respectively are side walls 86 and 88 respectively which terminate in a front wall 90. Front wall 90 has an opening with a forward projecting flange 92 which coacts with the projection 30 and walls 32 to complete the compartment for connector 34.

Figure 4:
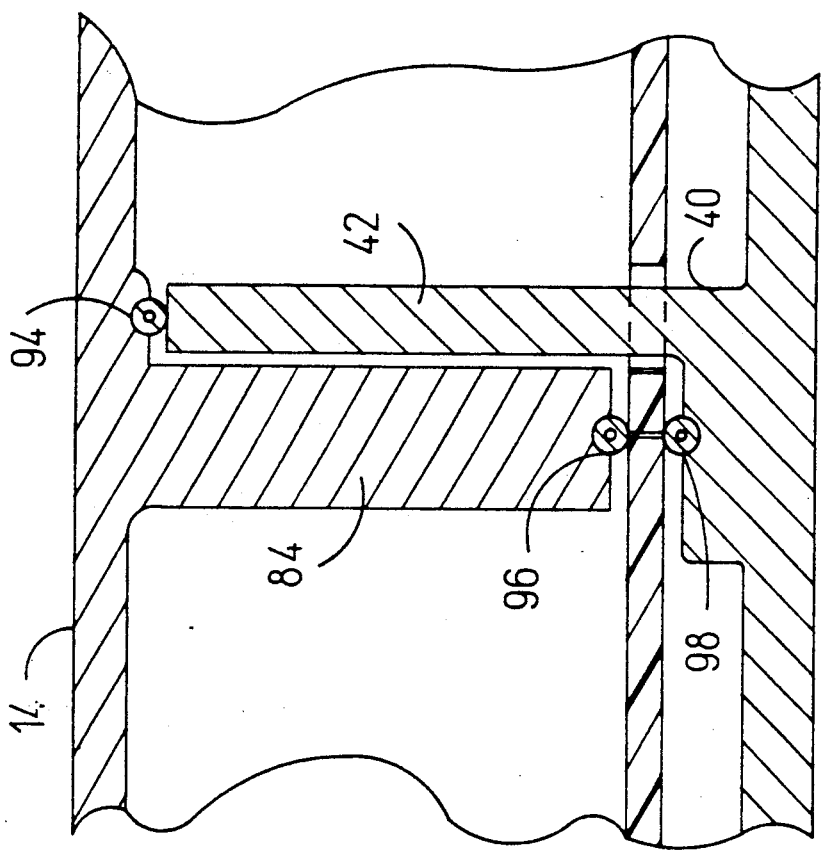
FIG. 4 is a sectional view through the separating wall in an assembled housing in a nonbridge area thereof.
Figure 3:
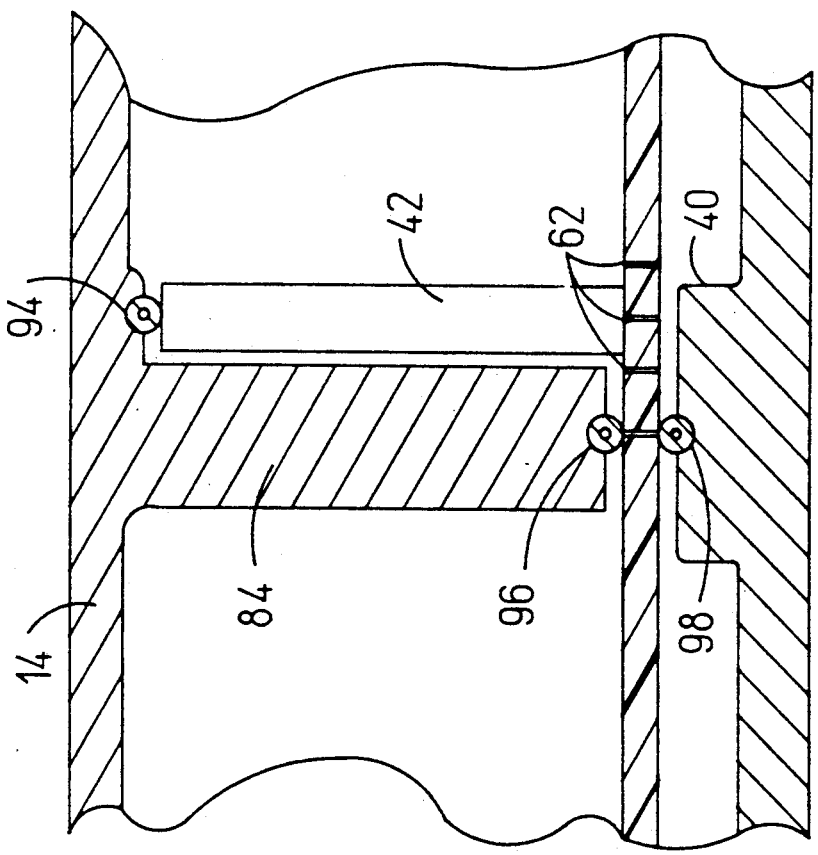
FIG. 3 is a sectional view through the separating wall in an assembled housing in the area of a bridge.

A conductive gasket 94 is fitted in a corresponding groove formed in the inside of top 76 and surrounding walls 78, 80, 82 and 84. A conductive gasket 96 is also fitted in a corresponding groove formed in the end of wall 84. Finally, a conductive gasket 98 is fitted in a corresponding groove in the top of boss 40, the gaskets 96 and 98 being positioned, as shown in FIGS. 3 and 4, such that when the members 12 and 14 are mated, the gaskets are adjacent each other on opposite sides of circuit board 36.

The assembly 10 is put together by initially mounting circuit board 36 in base member 12 as shown in FIG. 2 with the center portion of wall 42 and studs 46 passing through mating opening 56 in the circuit board and side portions of wall 42 passing through mating notches 58 in the circuit board. With the board in this position, the ground plane portion 66 of circuit 48 on the edge of the circuit board adjacent wall 38 is positioned over conductive gasket 98 in boss 40. Plated through holes 68 in this area are also over the conductive gasket.

The assembly is completed by mating cover member 14 to base member 12 with walls 78, 80, 82 and 84 being inside walls 22, 24, 26 and 38 respectively to form a double walled RF compartment. The side wall segments of wall 42 fit in the grooves 87 and 89, walls 86, 88 and 90 being inside walls 24, 26 and 28 respectively to form a double walled compartment for digital circuit 52. As previously indicated, the ground portion 66 of circuit 48 adjacent wall 38 is pinched between conducting gaskets 96 and 98, when the housing is fully assembled, the wall 38 thus being continued through the circuit board by the action of the conductive gaskets 96 and 98 and plated through holes 68. Leakage of RF energy around the junction between cover member 14 and base member 12 is inhibited by conductive gasket 94 which is in all areas of this junction. As may be best seen in FIGS. 3 and 4, the gasket 94 also functions to inhibit RF or other radiated leakage between the RF and digital compartments.

Once assembled, the vase and cover member may be held together by screws (not shown) which pass through screw holes 100 in cover member 14 and screw holes 102 in base member 12, or by other suitable means.

A modular housing assembly is thus provided which permits two incompatible circuits, such as an RF circuit and a digital circuit to be mounted on the same circuit board without resulting in unacceptable levels of radiated or conductive interference between the two circuits, while permitting desired signals to be transmitted between the two circuits. The circuit design is capable of achieving isolation between the two circuits of 60 db.

While the invention has been particularly shown and described above with respect to a preferred embodiment, it is apparent that the foregoing and other changes in form and detail may be made therein by one skilled in the art without departing from the spirit and scope of the invention.

What is claimed is:

1. A modular housing assembly for two incompatible circuits mounted on a common printed circuit board comprising:
    first and second compartments separated by a conductive wall, each of said compartments being surrounded on all sides by conductive material;
    at least one channel through said wall;
    means for mounting said printed circuit board with one of the circuits in said first compartment and the other circuit in said second compartment;
    said board including a bridge which physically and electrically connects said circuits, said bridge passing through a corresponding channel;
    a plurality of rows and columns of plated through holes formed in said bridge which holes connect ground planes, electrical wiring interconnecting said circuits passing through said bridge and being woven to pass between said holes; and
    a conductive gasket between each side of said board and said wall at least in the area of said bridge.

2. An assembly as claimed in claim 1 including filter means in each of said circuits between said interconnecting electrical wiring and the remainder of the circuit to block conductive interference between the circuits.

3. An assembly as claimed in claim 2 wherein said filter means are LC filters.

4. An assembly as claimed in claim 1 wherein said wall is a double wall.

5. An assembly as claimed in claim 4 wherein one wall of said double wall has at least one channel formed therethrough and the other wall is in two sections, one section above and one section below said board, said conductive gasket being on the facing ends of said sections.

6. An assembly as claimed in claim 1 wherein said assembly includes a base housing member having a conductive base, four conductive side walls and said separating conductive wall between two of said side walls at a point intermediate the ends of such sides; and a conductive cover housing member sized to mesh with said base housing member.

7. An assembly as claimed in claim 6 wherein said cover housing member has a conductive top, four conductive walls which are sized and positioned to mesh with the side wall of said base housing member to form a double walled housing assembly, and a separating conductive wall between two of the side walls at a point intermediate the ends of such side walls, said separating walls being adjacent when said housing members are meshed to form a double walled separator for said compartments.

8. An assembly as claimed in claim 6 including a conductive gasket at a junction between said housing members in at least the portion thereof surrounding one of said compartments.

9. An assembly as claimed in claim 1 wherein there is a matrix of said plated through holes which covers substantially the entire area of said bridge.

10. An assembly as claimed in claim 9 wherein there are at least three rows of said plated through holes with alternative rows being offset so that there is no straight path between the circuits through the matrix of bridge holes.

11. An assembly as claimed in claim 1 wherein said plated through holes are also formed around the periphery of at least a portion of at least one of said circuits.

12. An assembly as claimed in claim 11 wherein said plated through holes are formed about at least a portion of the periphery of both circuits.

13. An assembly as claimed in claim 1 wherein one of said circuits is an RF circuit.

14. An assembly as claimed in claim 13 wherein the other circuit is a digital circuit.

* * * * *